(12) United States Patent
Therrien et al.

(10) Patent No.: US 8,812,738 B2
(45) Date of Patent: Aug. 19, 2014

(54) METHOD AND APPARATUS FOR CONTENT-AWARE AND ADAPTIVE DEDUPLICATION

(71) Applicants: David G. Therrien, Nashua, NH (US); David Andrew Thompson, Boynton Beach, FL (US)

(72) Inventors: David G. Therrien, Nashua, NH (US); David Andrew Thompson, Boynton Beach, FL (US)

(73) Assignee: Exagrid Systems, Inc., Westborough, MA (US)

( * ) Notice: Subject to any disclaimer, the term of this patent is extended or adjusted under 35 U.S.C. 154(b) by 0 days.

(21) Appl. No.: 13/852,552

(22) Filed: Mar. 28, 2013

(65) Prior Publication Data

US 2013/0290474 A1   Oct. 31, 2013

Related U.S. Application Data

(63) Continuation of application No. 12/455,281, filed on May 29, 2009, now Pat. No. 8,412,848.

(51) Int. Cl.
*G06F 15/16* (2006.01)

(52) U.S. Cl.
USPC ........... 709/247; 709/231; 707/637; 707/661; 707/692; 382/238; 382/305; 382/224

(58) Field of Classification Search
USPC ................................................ 709/247, 231
See application file for complete search history.

(56) References Cited

U.S. PATENT DOCUMENTS

| | | | |
|---|---|---|---|
| 5,574,906 A | 11/1996 | Morris | |
| 5,990,810 A | 11/1999 | Williams | |
| 6,088,694 A | 7/2000 | Burns et al. | |
| 6,349,296 B1 * | 2/2002 | Broder et al. | ........................ 1/1 |
| 6,374,250 B2 | 4/2002 | Ajtai et al. | |

(Continued)

FOREIGN PATENT DOCUMENTS

EP    1641219 A2    3/2006

OTHER PUBLICATIONS

Broder, A.Z., "Identifying and Filtering Near-Duplicate Documents" CPM2000, 2000, vol. 1848, pp. 1-10.

(Continued)

*Primary Examiner* — Hamza Algibhah
*Assistant Examiner* — Natisha Cox
(74) *Attorney, Agent, or Firm* — Mintz Levin Cohn Ferris Glovsky and Popeo, P.C.

(57) ABSTRACT

A method, a system, an apparatus, and a computer readable medium for transmission of data across a network are disclosed. The method includes receiving a data stream, analyzing the received data stream to determine a starting location and an ending location of each zone within the received data stream, based on the starting and ending locations, generating a zone stamp identifying the zone, the zone stamp includes a sequence of contiguous characters representing at least a portion of data in the zone, wherein the order of characters in the zone stamp corresponds to the order of data in the zone, comparing the zone stamp with another zone stamp of another zone in any data stream received, determining whether the zone is substantially similar to another zone by detecting that the zone stamp is substantially similar to another zone stamp, delta-compressing zones within any data stream received that have been determined to have substantially similar zone stamps, thereby deduplicating zones having substantially similar zone stamps within any data stream received, and transmitting the deduplicated zones across the network from one storage location to another storage location.

29 Claims, 10 Drawing Sheets

(56) References Cited

U.S. PATENT DOCUMENTS

| | | | |
|---|---|---|---|
| 6,658,423 | B1 | 12/2003 | Pugh et al. |
| 7,386,569 | B2 | 6/2008 | Berstis et al. |
| 2005/0044294 | A1 | 2/2005 | Vo et al. |
| 2005/0108414 | A1* | 5/2005 | Taylor et al. .................. 709/231 |
| 2005/0283500 | A1 | 12/2005 | Eshghi et al. |
| 2007/0018858 | A1* | 1/2007 | McCanne et al. ................ 341/50 |
| 2007/0239947 | A1* | 10/2007 | Li et al. ......................... 711/154 |
| 2008/0294660 | A1* | 11/2008 | Patterson et al. ............. 707/100 |
| 2010/0125553 | A1* | 5/2010 | Huang et al. .................. 707/661 |
| 2010/0250501 | A1* | 9/2010 | Mandagere et al. .......... 707/692 |
| 2010/0306412 | A1 | 12/2010 | Therrien et al. |

OTHER PUBLICATIONS

Brin S., Davis J., Garcia-Molina H., "Copy Detection Mechanisms for Digital Documents" Dept. of Computer Science, Stanford University, Stanford, California.

Broder A.Z., "On the resemblance and containment of documents" Digital Systems Research Ctr., Palo Alto, CA.

Broder A.Z., Glassman S.C., Manasse M.S., Zweig G., "Syntactic Clustering of the Web", Jul. 1997, Systems Research Ctr., Palo Alto, CA, http://www.research.digital.com/SRC/.

Burns R.C., "Differential Compression: A Generalized Solution for Binary Files" Dec. 1996, U. of Cal. At Santa Cruz.

Computer Science and NYU Dept. of Computer Science.

European Search Report from EP 10 16 3819 dated Oct. 1, 2010.

Douglis F., Iyengar A., "Application-specific Delta-encoding via Resemblance Detection" USENIX Annual Technical Conference, 2003.

Fetterly D., Manasse M., Najork M., "On the Evolution of Clusters of Near-Duplicate Web Pages" IEEE, Proceedings of the First Latin American Web Congress 2003.

Heintze N., "Scalable Document Fingerprinting (Extended Abstract)" Bell Laboratories, Murray Hill, New Jersey.

Hoad T.C., Zobel J., "Methods for Identifying Versioned and Plagiarised Documents" School of Computer Science and Information Technology, RMIT University, Melborne, Australia.

Hyyro H., "A Bit-Vector Algorithm for Computing Levenshtein and Damerau Edit Distances" Dept. of Computer and Information Sciences, University of Tampere—Finland.

Karp R.M., Rabin M.O., "Efficient randomized pattern-matching algorithms" IBM J. Res. Develop., Mar. 1987, vol. 31, No. 2, pp. 249-260.

Levenshtein V.I., "Binary Codes Capable of Correcting Delections, Insertions, and Reversals" Translated from Doklady Adademii Nauk SSSR, Aug. 1965, vol. 163, No. 4., pp. 845-848.

Manber U., "Finding Similar Files in a Large File System" Oct. 1993, Dept. of Computer Science, U. of Arizona, pp. 1-10.

Muthitacharoen A., Chen B., Mazieres D., "A Low-bandwidth Network File System" MIT Laboratory for.

Myers G., "A Fast Bit-Vector Algorithm for Approximate String Matching Based on Dynamic Programming", Journal of the ACM, May 1999, vol. 46., No. 3., pp. 395-415.

Ouyang Z., Memon N., Suel T., Trendafilov D., "Cluster-Based Delta Compression of a Collection of Files" CIS Dept., Polytechnic University, Brooklyn, New York.

Schleimer S., Wilkerson D.S., Aiken A., "Winnowing: Local Algorithms for Document Fingerprinting" Sigmod 2003, Jun. 2003.

Tridgell A., "Efficient Algorithms for Sorting and Synchronization" Thesis submitted for Doctor of Philosophy at Australian National University, Feb. 1999.

* cited by examiner

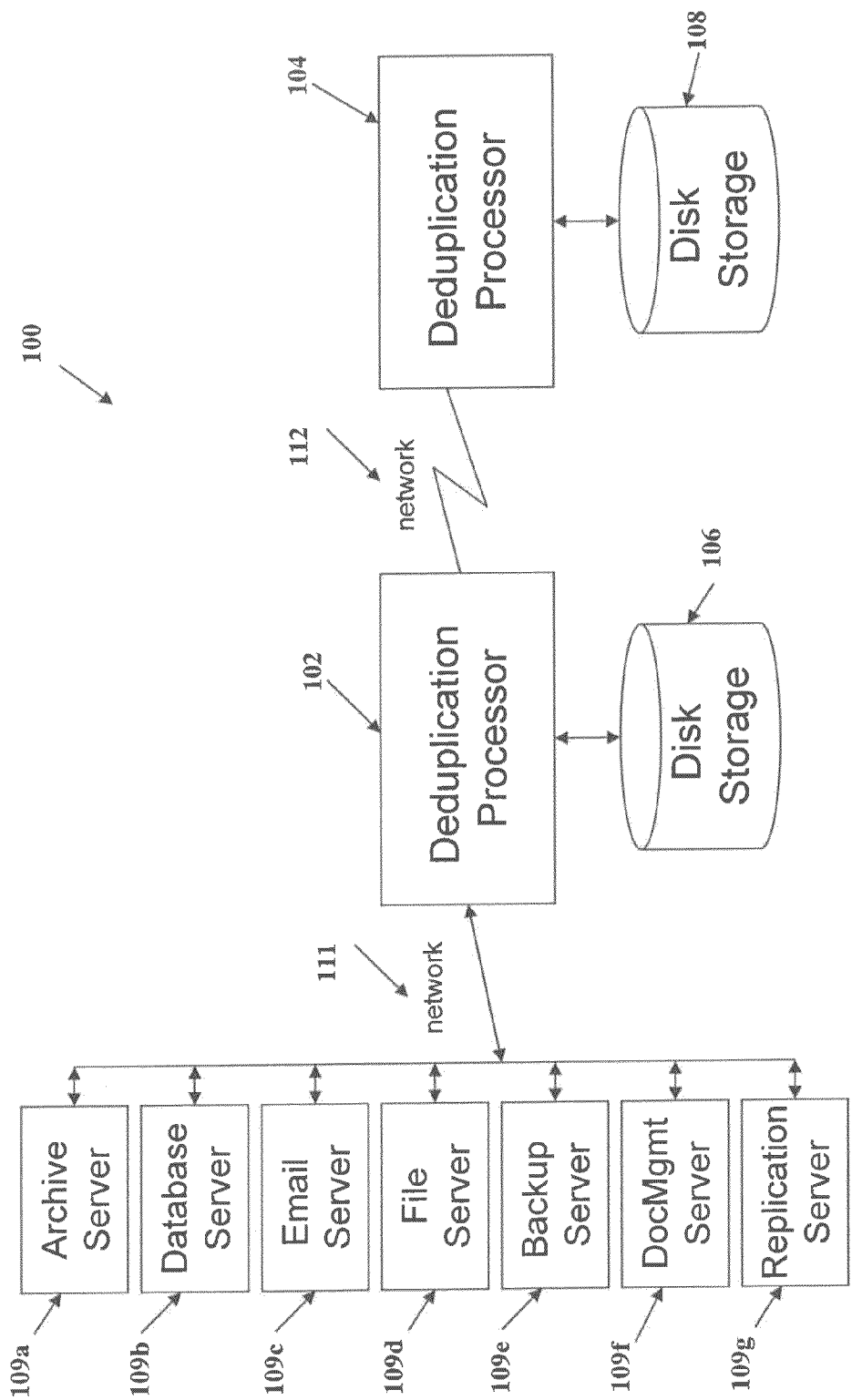

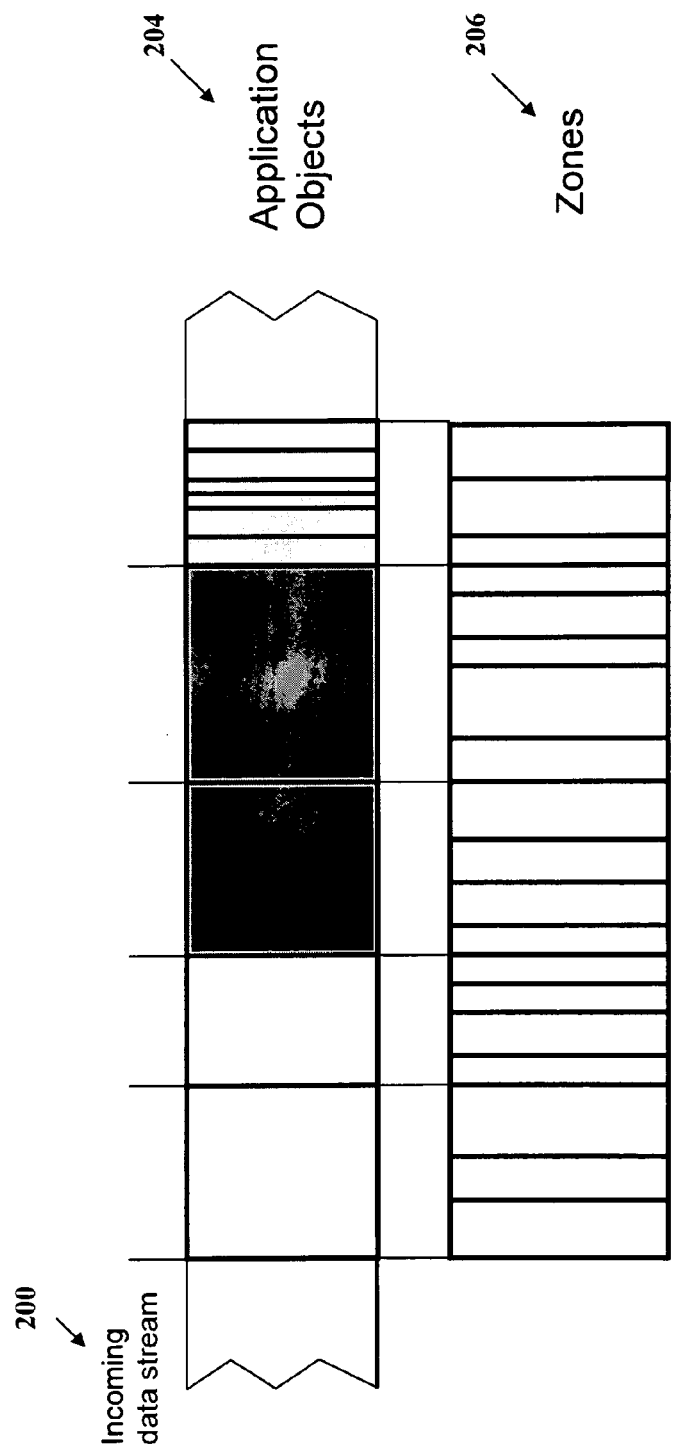

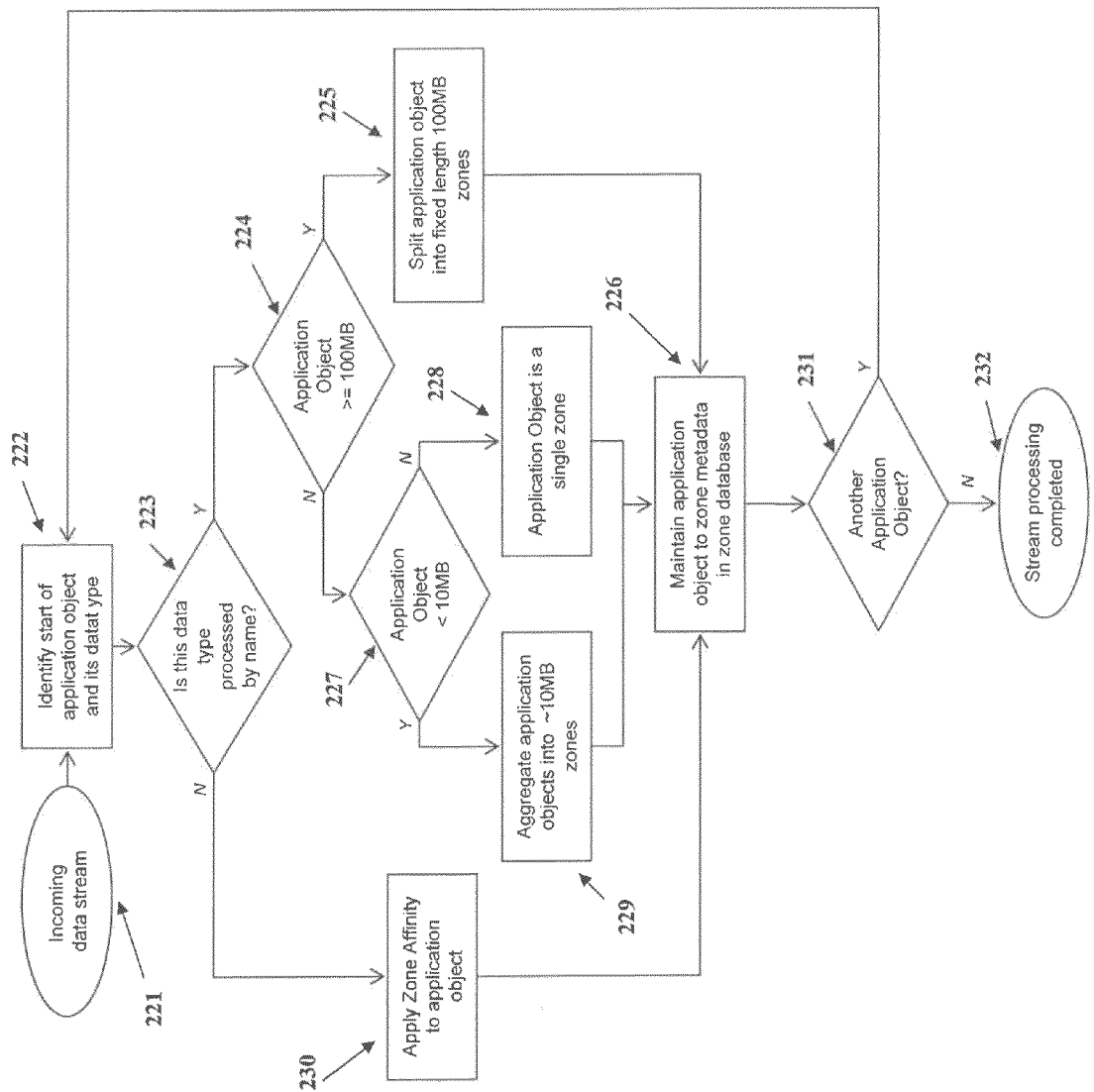

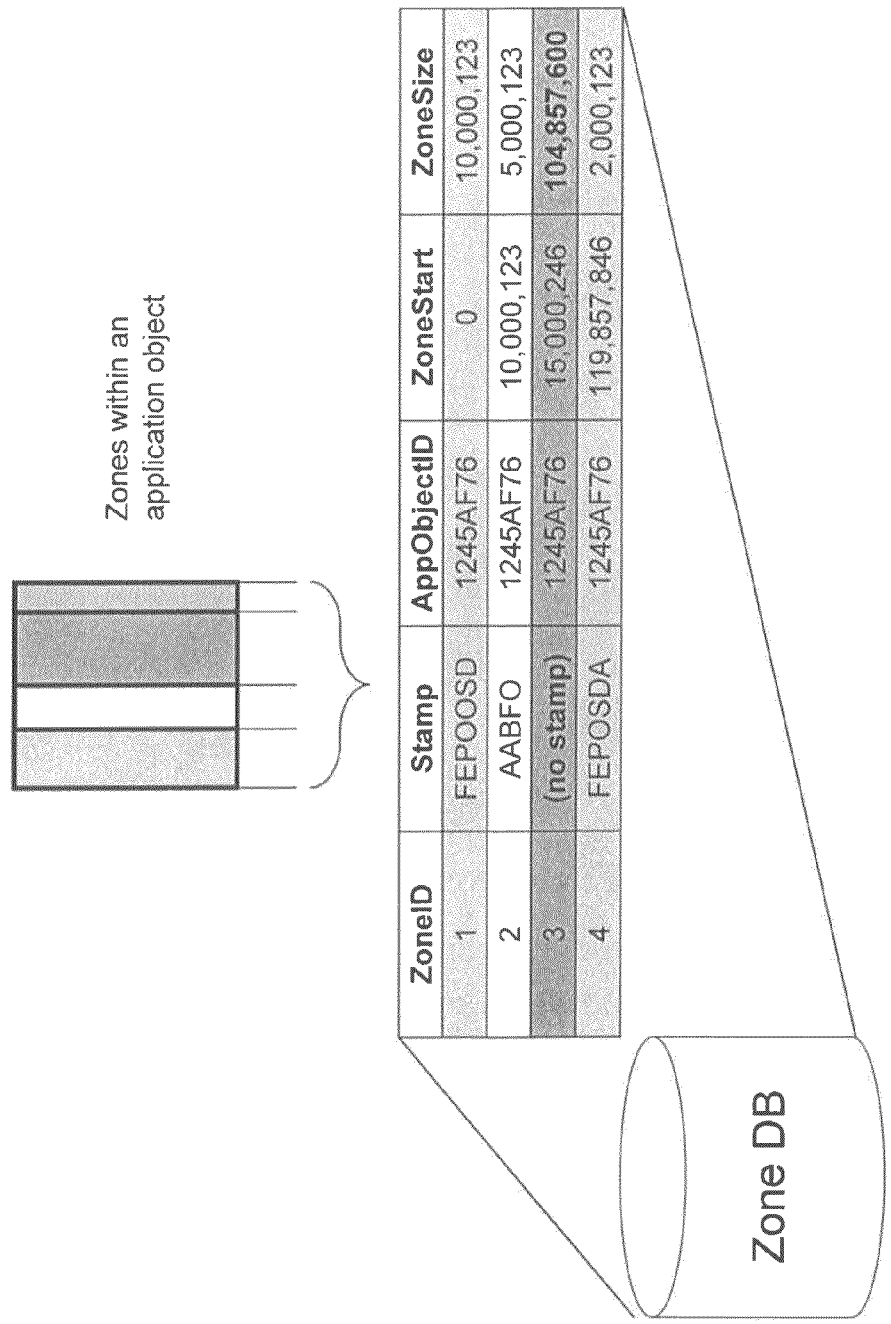

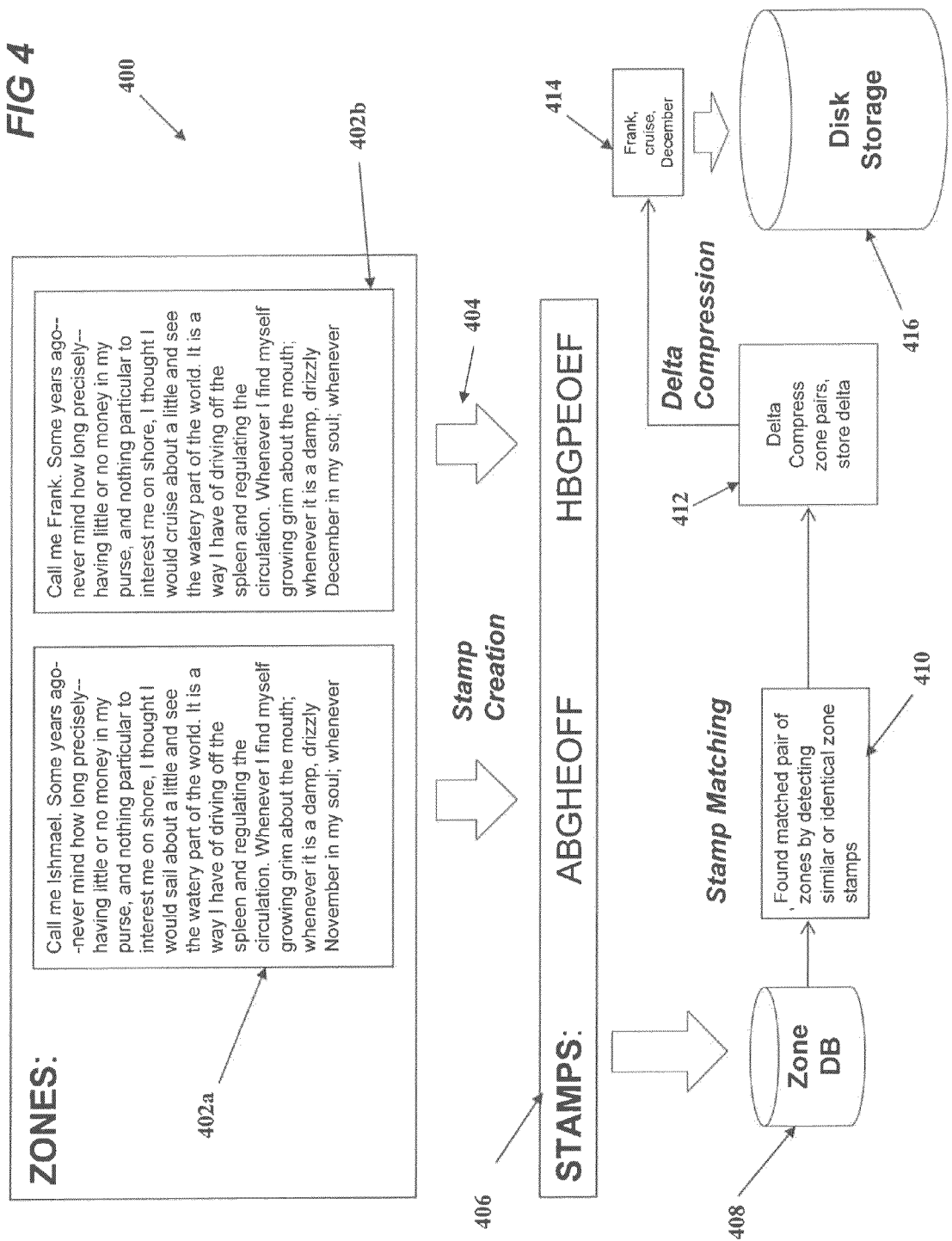

FIG 6

|   |   | k | i | t | t | e | n |
|---|---|---|---|---|---|---|---|
|   | 0 | 1 | 2 | 3 | 4 | 5 | 6 |
| s | 1 | 1 | 2 | 3 | 4 | 5 | 6 |
| i | 2 | 2 | 1 | 2 | 3 | 4 | 5 |
| t | 3 | 3 | 2 | 1 | 2 | 3 | 4 |
| t | 4 | 4 | 3 | 2 | 2 | 3 | 3 |
| i | 5 | 5 | 4 | 3 | 3 | 2 | 3 |
| n | 6 | 6 | 5 | 4 | 4 | 3 | 2 |
| g | 7 | 7 | 6 | 5 | 5 | 4 | 3 |

← Edit distance

*Source: Wikipedia*
http://en.wikipedia.org/wiki/Levenshtein_distance

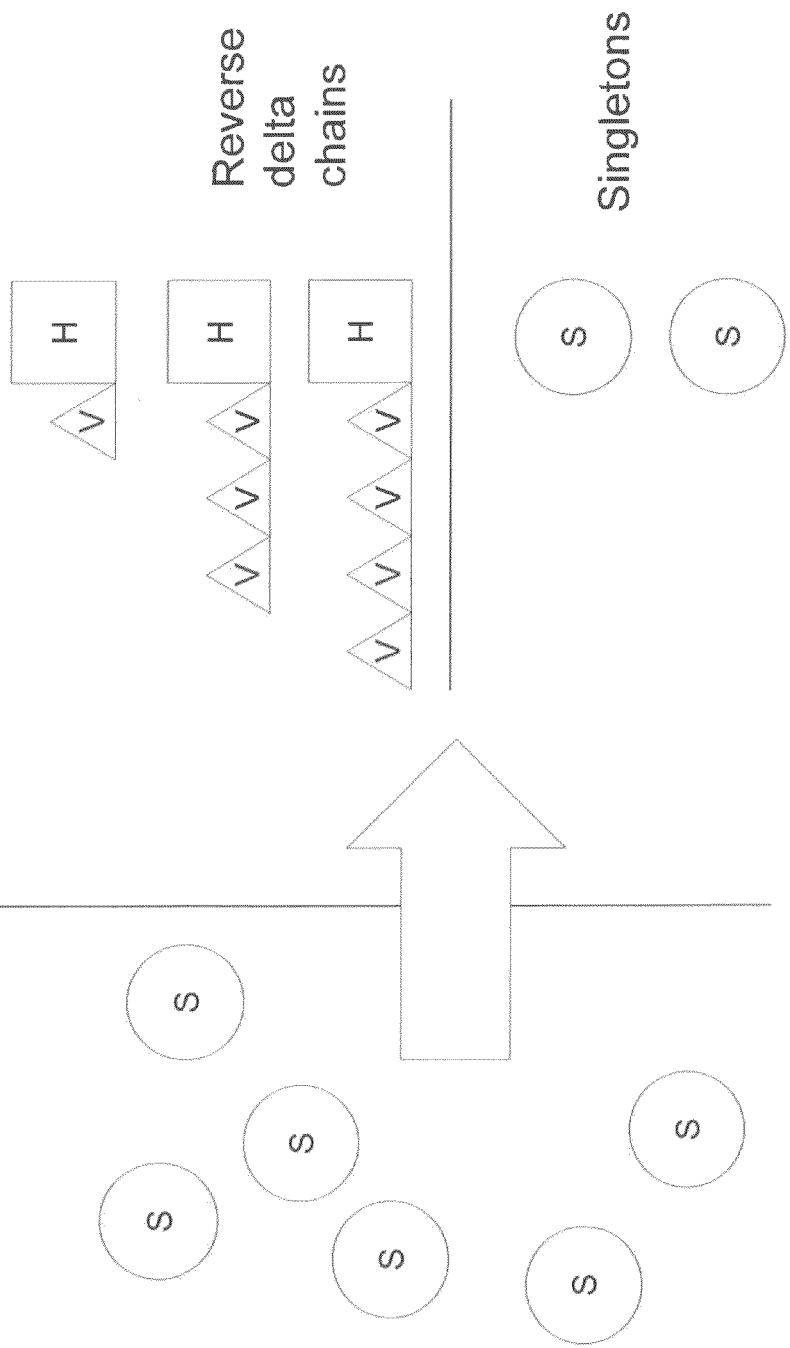

METHOD AND APPARATUS FOR CONTENT-AWARE AND ADAPTIVE DEDUPLICATION

CROSS-REFERENCE TO RELATED APPLICATIONS

The present application is a continuation of and claims priority to U.S. patent application Ser. No. 12/455,281, filed on May 29, 2009, and incorporates its disclosure herein by reference in its entirety.

BACKGROUND OF THE INVENTION

1. Field of the Invention

The present invention relates to systems and methods for storing and transmitting data. In particular the present invention relates to a system and methods for storing data that are configured to leverage a content-aware and adaptive deduplication process as a form of electronic data compression for efficiently storing and transmitting data.

2. Background

Deduplication involves identifying similar or identical patterns of bytes within a data stream, and replacing those bytes with fewer representative bytes. By doing so, deduplicated data consumes less disk storage capacity than data that has not been deduplicated and when the data stream must be transmitted between two geographically separate locations, consumes less network bandwidth. Adaptive deduplication strategies combine inter-file and/or intra-file discovery techniques to achieve the aforementioned goals.

Deduplication can be used to reduce the amount of primary storage capacity that is consumed by email systems, databases and files within file systems. It can also be used to reduce the amount of secondary storage capacity consumed by backup, archiving, hierarchical storage management (HSM), document management, records management and continuous data protection applications. In addition, it can be used to support disaster recovery systems which provide secondary storage at two or more geographically dispersed facilities to protect from the total loss of data when one site becomes unavailable due to a site disaster or local system failure. In such a case, deduplication helps to reduce not only the amount of data storage consumed, but also the amount of network bandwidth required to transmit data between two or more facilities.

Many popular deduplication apparatus employ deduplication methods that are not aware of specific application-level content within their incoming data streams. Examples of application-level content include but are not limited to Microsoft Exchange data stores, Microsoft SQL Server and Oracle databases, Solaris, Windows, and Linux file systems, Microsoft and VMware virtual machine images, Network Data Management Protocol ("NDMP") dumps, etc.

The lack of application-level content awareness in many deduplication apparatuses precludes their ability to identify the data type or types that are not achieving acceptable levels of deduplication. This occurs, for example, when the incoming data stream includes regions of data that are encrypted or pre-compressed, or with databases that are re-indexed—all of which typically produce below average deduplication ratios. Poor deduplication ratios cause an increase in the consumption of local disk storage capacity and inter-site WAN bandwidth.

While content awareness is a key element of a manageable deduplication system, another important architectural metric is related to the size of the managed deduplicated objects. If the size of each deduplicated object is set to be too small, the amount of metadata that must be employed to manage each small object becomes untenable. As an example, most deduplication systems that are commercially popular today operate on a model of identifying identical chunks of kilobyte ("KB") sized deduplicated objects. On a 10 terabyte ("TB") appliance with a 10 KB average chunk size, one billion deduplicated objects must be identified and managed. With commonly available main memory system capacities, it is unlikely that the entire metadata collection of one billion deduplicated objects can be maintained in memory, so performance is degraded as metadata must be paged into and out of memory during the metadata matching processes.

Thus, there is a need to provide an adaptive deduplication technique that operates on the premise of identifying and managing regions of contiguous bytes, termed "zones," from an incoming data stream as large as tens of megabytes ("MB") that might be similar, but not necessarily identical to other zones so that these zones produce very effective deduplication. By managing zones of relatively large size, the amount of metadata that must be maintained is reduced by three orders of magnitude, allowing all zone metadata to be easily retained in main memory during deduplication processing.

SUMMARY OF THE INVENTION

In some embodiments, the present invention relates to a deduplication processor apparatus that includes networking, memory, and at least one central processing unit ("CPU") that can execute content-aware and adaptive data deduplication methods. This deduplication processor also connects internally or externally with disk storage.

In the following description, data management applications are considered as a general source of data streams for the present invention's apparatus. Data management applications include but are not limited to the primary storage of end-user files, databases, and email systems, as well as data from backup, archive, HSM, document and records management or replication applications. This deduplication processor apparatus accepts data streams from any and all data management sources and executes adaptive data deduplication methods.

In some embodiments, the present invention is concerned with a data storage apparatus, system and method for adapting deduplication processing activity based on the awareness of specific major content types found within the data stream.

As part of the adaptive deduplication system, a unique method for identifying zones of data within a data stream and associating a stamp with each zone will be described. With these zones and their stamps, sufficiently similar content will be later matched and adaptively data compressed or delta compressed in order to reduce the amount of data that needs to be stored and/or transmitted.

In some embodiments, the present invention relates to a method for transmission of data across a network. The method begins by receiving a data stream and analyzing the received data stream to determine a starting location and an ending location of each zone within the data stream. Subsequently, based on each zone's starting and ending locations, zone stamps are generated identifying each zone. A zone stamp includes a sequence of contiguous characters identifying a representative portion of data in the zone, where the order of characters in the zone stamp corresponds to the order of data in the zone. By comparing a zone stamp with the stamp of another zone, irrespective of the data stream from which it originated, it can be ascertained whether the zone is substantially similar to another zone by detecting similarity, not necessarily identical matches, between the zone stamps. Zones within any data stream received that have been determined to have substantially similar zone stamps can be delta compressed, thereby deduplicating zones of substantial similarity, and transmitting the deduplicated zones across the network from one storage location to another storage location.

In some embodiments, the above method further includes storing the zone stamp in a zone database, wherein the zone database is configured to store zone stamps of the zones within any data stream received.

In some embodiments, the delta-compressing step further includes eliminating redundant data from any data stream received.

In some embodiments, each zone in any data stream received is characterized by a predetermined minimum and maximum zone size and a predetermined minimum and maximum zone stamp length. The zones that are to be delta-compressed have a size greater than the predetermined minimum zone size and less than the predetermined maximum size and a stamp length greater than the predetermined minimum zone stamp length.

In some embodiments, the analyzing step further includes defining an end zone located at an end of the received data stream.

In some embodiments, the generating a zone stamp step further includes aggregating the defined end zone with a zone preceding the defined end zone for delta-compressing, when size of the defined end zone is less than the predetermined minimum zone size.

In some embodiments, the generating a zone stamp step further includes aggregating the defined end zone with a zone preceding the defined end zone for delta-compressing, when a total combined length of zone stamps for the defined end zone and the zone preceding the defined zone is less than the predetermined maximum zone stamp length.

In some embodiments, the generating a zone stamp step also includes creating a separate end zone stamp for the defined end zone for delta-compressing, when size of the defined end zone is greater than the predetermined minimum zone size and the predetermined minimum zone stamp length.

In some embodiments, the generating a zone stamp step can include aggregating the defined end zone with a zone preceding the defined end zone for delta-compressing, when a total combined length of zone stamps of the defined end zone and a zone preceding the defined end zone is less than the predetermined maximum zone stamp length. The zone stamp of the preceding zone remains unchanged.

In some embodiments, the zone stamp has a fixed length. In alternate embodiments, the zone stamp has a variable length.

In some embodiments, the zone is a low entropy data zone, wherein the low entropy data zone includes homogeneous data within any data stream received.

In some embodiments, the comparing step also includes comparing zone stamps of zones having a difference in respective zone sizes that is less than or equal to a predetermined zone size difference. Any zones having a difference in respective zone sizes that is greater than the predetermined zone size difference are not compared to each other.

In some embodiments, if upon determining that compared zones are substantially similar to one another, discontinuing comparison of at least one compared zone to other zones in any data stream received.

The determining step can include computing an edit distance score between the compared zone stamps, wherein the edit distance score is configured to reflect the number of differences between the compared zone stamps, wherein each compared zone stamp is limited by a predetermined maximum zone stamp length.

In some embodiments, the determining step can also include comparing the computed edit distance score to a predetermined threshold distance score and determining that the compared zones are substantially similar when the computed edit distance score is less than the predetermined threshold distance score.

In some embodiments, the computed edit distance score closer to zero indicates that the compared zones are substantially similar. The predetermined threshold distance score is a function of a length of a shorter of zone stamps being compared.

In some embodiments, the determining whether the zone is substantially similar to another zone step further includes upon comparison of zone stamps of zones, selecting a best match between a pair of zones in any data stream received for comparison with other zones in any data stream received.

In some embodiments, the present invention relates to a system for transmission of data across a network. The system includes a processor coupled to a storage system. The processor is configured to receive a data stream and analyze the received data stream to determine a starting location and an ending location of each zone within the data stream. Subsequently, based on each zone's starting and ending locations, zone stamps are generated identifying each zone. A zone stamp includes a sequence of contiguous characters identifying a representative portion of data in the zone, where the order of characters in the zone stamp corresponds to the order of data in the zone. By comparing a zone stamp with the stamp of another zone, irrespective of the data stream from which it originated, it can be ascertained whether the zone is substantially similar to another zone by detecting similarity, not necessarily identical matches, between the zone stamps. Zones within any data stream received that have been determined to have substantially similar zone stamps can be delta compressed, thereby deduplicating zones of substantial similarity, and transmitting the deduplicated zones across the network from one storage location to another storage location.

In some embodiments, the present invention relates to a method for deduplicating data across a network. The method begins by receiving a data stream and analyzing the received data stream to determine a starting location and an ending location of each zone within the data stream. Subsequently, based on each zone's starting and ending locations, zone stamps are generated identifying each zone. A zone stamp includes a sequence of contiguous characters identifying a representative portion of data in the zone, where the order of characters in the zone stamp corresponds to the order of data in the zone. By comparing a zone stamp with the stamp of another zone, irrespective of the data stream from which it originated, it can be ascertained whether the zone is substantially similar to another zone by detecting similarity, not necessarily identical matches, between the zone stamps. Zones within any data stream received that have been determined to have substantially similar zone stamps can be delta compressed, thereby deduplicating zones of substantial similarity, and transmitting the deduplicated zones across the network from one storage location to another storage location.

In some embodiments, the present invention relates to a computer-readable medium encoded with computer program instructions for performing method for transmitting data across a network. The method begins by receiving a data stream and analyzing the received data stream to determine a starting location and an ending location of each zone within the data stream. Subsequently, based on each zone's starting and ending locations, zone stamps are generated identifying each zone. A zone stamp includes a sequence of contiguous characters identifying a representative portion of data in the zone, where the order of characters in the zone stamp corresponds to the order of data in the zone. By comparing a zone stamp with the stamp of another zone, irrespective of the data stream from which it originated, it can be ascertained whether the zone is substantially similar to another zone by detecting similarity, not necessarily identical matches, between the zone stamps. Zones within any data stream received that have been determined to have substantially similar zone stamps can be delta compressed, thereby deduplicating data of substantial similarity, and transmitting the deduplicated data across the network from one storage location to another storage location.

In some embodiments, the present invention relates to a system for storing data. The system includes a deduplication processor communicating with a disk storage element, wherein the deduplication processor is configured to receive a data stream from a plurality of sources. The deduplication processor is configured to analyze the received data stream to determine a starting location and an ending location of each zone within any data stream received, based on the starting and ending locations of each zone, generate a zone stamp identifying the zone, the zone stamp includes a sequence of contiguous characters that represent the data within the zone, wherein the order of characters in the zone stamp corresponds to the order of data in the zone, compare the zone stamp with another zone stamp of another zone in the incoming or previously received data stream, determine whether the zone is substantially similar or identical to another zone by detecting that the zone stamp is substantially similar or identical to another zone stamp, delta-compress zones within the incoming and previously received data streams that have been determined to have substantially similar or identical zone stamps, thereby deduplicating data having substantially similar or identical zone stamps within the received data stream, and transmit the deduplicated data to the storage device for storage.

BRIEF DESCRIPTION OF THE DRAWINGS

FIG. 1 illustrates an exemplary system for deduplicating data from various sources, according to some embodiments of the present invention.

FIG. 2a illustrates an exemplary method for adaptively processing an incoming data stream into application objects, and a further subdivision of those application objects into zones, according to some embodiments of the present invention.

FIG. 2b is a flowchart illustrating an exemplary method for adaptively processing an incoming data stream into application objects, and a further subdivision of those application objects into zones, according to some embodiments of the present invention.

FIG. 3 illustrates an exemplary result of executing the zone affinity method for generating zones and their respective stamps, as detailed in FIG. 2c.

FIG. 4 illustrates exemplary processes of stamp creation, stamp matching and delta compression, according to some embodiments of the present invention.

FIG. 6 illustrates an exemplary Levenshtein edit distance matrix calculation.

FIG. 7 illustrates an exemplary method for storing zones of data as delta compressed zones, according to some embodiments of the present invention.

DETAILED DESCRIPTION OF THE INVENTION

Figure 2C:
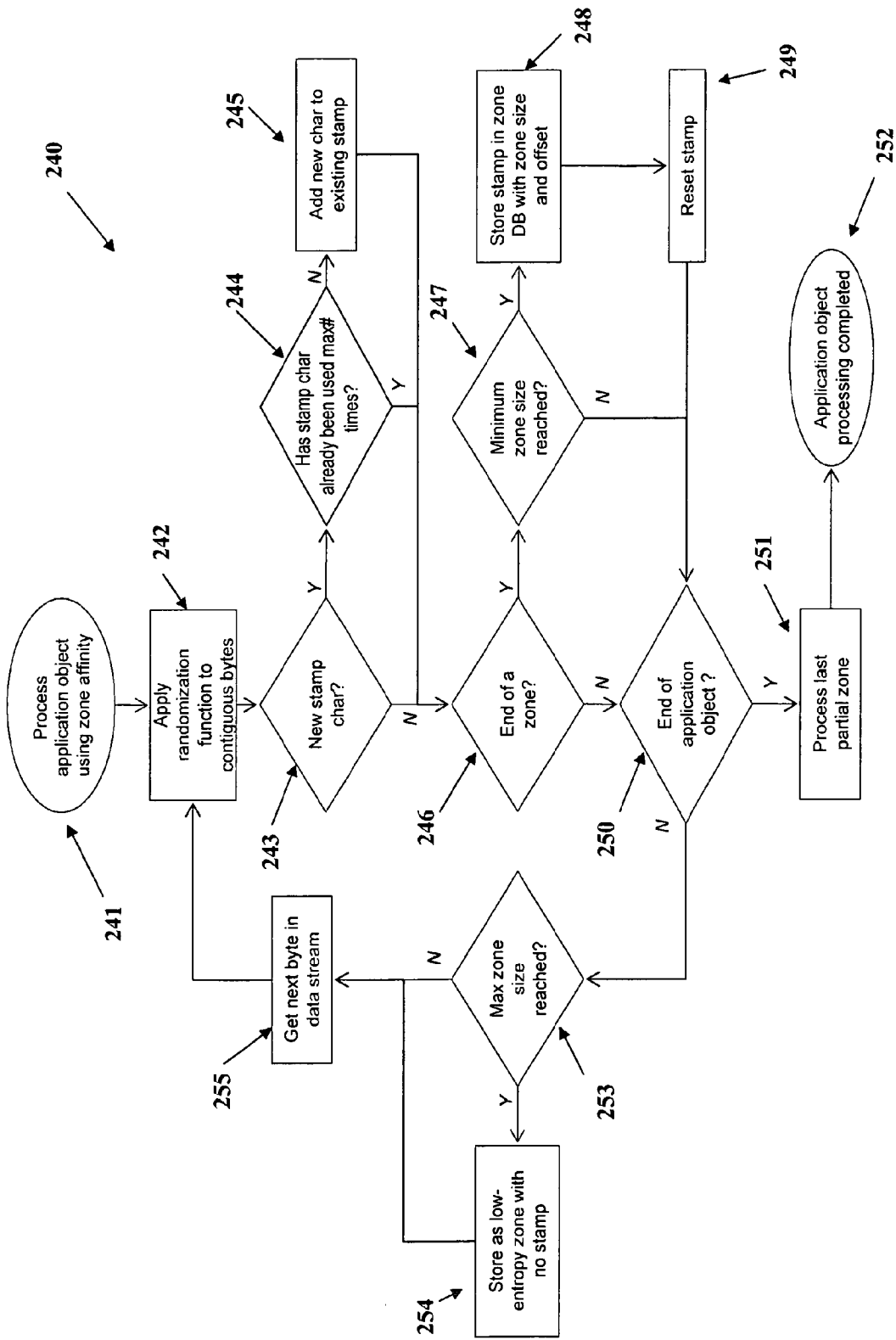
FIG. 2c is a flowchart illustrating an exemplary method for processing an application object by employing a zone affinity method, according to some embodiments of the present invention.

FIG. 1 illustrates an exemplary data deduplication system for deduplicating a sample of data received from a variety of application sources, where the system includes a deduplication processor apparatus and associated disk storage, according to some embodiments of the present invention. Data management applications such as archiving, disk backup, document and records management, hierarchical storage management as well as primary data storage of database, email and file system can all benefit from deduplication by sending data through a deduplication processor apparatus before storing it on the disk storage apparatus. In some embodiments, the deduplication processor can be responsible for deduplicating data that it receives from these data sources, and also, for reconstituting the original un-deduplicated data, when requested to do so by an application. This occurs in a manner that is transparent to the data management application.

FIG. 1 illustrates a deduplication system 100 having a deduplication processor 102 optionally connected to another deduplication processor 104 across a network connection 112. Each deduplication processor has respective disk storage 106, 108. The deduplication processor 102 receives data streams from various sources 109 (a, b, c, d, e, f, g) all connected via a network 111. Sources 109 may include but are not limited to an archive server, database server, email server, fileserver, backup server, document management server, or replication server. As can be understood by one skilled in the art, other sources of data can be implemented or used. Upon receipt of un-deduplicated data from the data management sources 109, the deduplication processor performs deduplication procedures according to the present invention (as discussed below). The deduplicated data is then stored in the disk storage 106. The deduplicated data can also be sent to another processor 104 and stored at the disk storage 108. The deduplication processor 104 and disk storage 108 can be remotely located with respect to deduplication processor 102 and disk storage 106.

Specifically, critical application data may need to be stored at a local facility (represented by deduplication processor 102 and disk storage 106) and at a geographically distant remote facility (deduplication processor 104 and disk storage 108) in order to provide for a full recovery in the event of system failure, site disaster, or any other unprecedented condition or event. FIG. 1 also shows that the deduplication taking place at the primary/local site for the purpose of reducing primary/local site disk storage capacity consumption can also be leveraged to reduce bandwidth requirements between the deduplication processors located at the two sites connected via network 112.

The network connection 112 illustrated in FIG. 1 may represent a connection to one more deduplication processors, either networked at local sites or located at remote facilities. The present invention is not limited by this illustration to only two deduplication processors, and it can be easily understood by one skilled in the art that there is no limit to the number of deduplication processors that can comprise 102 or 104. Networks 111 and 112 can be (such as, LAN, WAN, MAN, or any other suitable network), and as can be understood by one skilled in the art, these elements are provided here for illustrative purposes only and are not intended to limit the present invention.

FIG. 2*a* illustrates an exemplary process for identifying "application objects" within an incoming data stream, according to some embodiments of the present invention. As shown in FIG. 2*a*, the data stream 200 can include a plurality of application objects 204, each of which can include either a single zone or a plurality of zones as represented by 206. As such, the data stream 200 can be subdivided into a plurality of zones 206, or multiple application objects can be aggregated into a single zone. An application object 204 might represent a single database, email data store, file within a file system, virtual machine image, NDMP dump, or any other type of application object within data stream 200. The present invention can be configured to utilize knowledge of application object content of a data stream to provide application object reporting to users of this invention. The content-aware metadata associated with these application objects allows for the reporting of deduplication effectiveness among the various application objects within the same application region.

Within each application object, zones are identified using an adaptive deduplication method, according to some embodiments of the present invention. FIG. 2*b* is a flowchart illustrating an exemplary method for adaptively deduplicating an application object using criteria defining whether application object name-based processing is appropriate for that application object.

For name-based processing, large application objects (>100 megabytes ("MB")) processed by object name are segmented into 100 MB fixed size zones, while small application objects (<10 MB) processed by object name are aggregated into variable sized zones of between 10 MB and 50 MB. In some embodiments, name-based processing involves use of data management information about a particular object, such as a string identifying a file on a server, in a directory and/or folder(s) (by way of a non-limiting example, server_name/directory/folder/file_name), and further comparison of such string with a string that has been previously received and catalogued by the system. If a received object has an object name that has been already catalogued, then comparison may yield meaningful results.

Application objects that are not processed by their application object name are processed using a zone affinity method. Such method avoids reliance on object names and allows one to compare objects, e.g., files, that may be similar yet having different file names.

Referring to FIG. 2*b*, the method 220 performed by present invention's deduplication processor (FIG. 1) begins with receiving an incoming data stream (Step 221). In Step 222, the received stream is analyzed by identifying the starting offset of an application object and its associated data type. In Step 223, a determination is made whether to process the application object by its application object name or using zone affinity. If by-name processing is elected, the method 220 proceeds to Step 224. If not, then Step 230 is executed, where the zone affinity method is used for processing the application object. (The details of this method are discussed below with reference to FIG. 2*c*.). In either case, the metadata associating the application object to the one or more zone(s) that have been created by zone affinity are maintained in the zone database ("DB"), Step 226. Then, the method proceeds to determine whether there is another application object to process (Step 231). If there is another application object to process (Step 231), processing returns to Step 222. Otherwise, the method terminates at Step 232 by completing processing.

Referring back to Step 224, when processing the application object as a named object, if its size is larger than 100 MB the data stream is segmented into fixed length 100 MB zones (Step 225). Alternatively, multiple application objects of size smaller than 10 MB can be aggregated to create a zone of approximately 10-50 MB in size (Step 229). Application objects larger than 10 MB but less than 100 MB, are represented as single zones (Step 228). In all cases, the application object to zone metadata relationship is maintained in the zone DB (Step 226). In some embodiments, zones having an aggregate of multiple small application objects (Step 229) can be identified in the zone DB using the name of the first application object of the aggregate. As can be understood by one skilled in the art, other predetermined or predefined numerical values can be used to produce smaller or larger average zone sizes, and the present invention is not limited to the values illustrated herein.

The determination of whether to process an application object by name or using the zone affinity method need not be based on the content of the data stream 221. In some embodiments, the present invention permits for the determination of name-based processing to be made through configuration prior to the incoming data stream 221, which may include but is not limited to processing all data arriving via a specific Network Attached Storage ("NAS") share, including but not limited to "NFS" (Network File System), "CIFS" (Common Internet File System), "FTP" (File Transfer Protocol) and "VTL" (Virtual Tape Library) tapes in the same manner, either based upon names gleaned from application objects detected in the data stream or entirely using zone affinity. For example, if it is so configured that all incoming application objects, regardless of their structure or origin should be processed using the zone affinity method, only Step 230 would be applicable, as illustrated in FIG. 2*b*.

FIG. 2*c* is a flowchart illustrating an exemplary method 240, performed by the present invention's deduplication processor (as shown in FIG. 1) for processing an application object using the zone affinity method (as shown in FIG. 2*b*, Step 230) and computing its representative zone stamps, according to some embodiments of the present invention. Variable-sized zones within each application object are identified through the use of a randomization function applied to the contents of the data stream. Some conventional deduplication systems use schemes for segmenting data streams into extremely small 4 KB-16 KB chunks so that byte-for-byte identical chunks can be matched. Such granular splitting of the data stream can make these systems inefficient due to the large number (e.g., billions) of chunk metadata entries that must be maintained. In contrast, rather than seeking regions of exactly matching data, the present invention's system and method maintains larger 10-100 MB (or any other predetermined or predefined value) zones that are substantially similar to each other so that pairs of these substantially similar zones can be later delta compressed against each other, thereby deduplicating data streams faster and more efficiently. Zone stamps are character strings where each character in the string represents a consecutive collection of bytes within its zone and where the order of the characters in the zone stamp reflects the order of data within each zone.

Processing an application object using zone affinity, as illustrated in FIG. 2*c*, begins with Step 241, wherein a start of a new application object is identified. In step 242, a randomization function is applied to a range of contiguous bytes at the current byte offset. Based on the resulting value of the randomization function from Step 242, a determination is made whether a new zone stamp character has been found (Step 243). If so, that character is only added to the zone stamp if it has not already been utilized a maximum number of times (Step 244), ensuring that homogeneous data cannot overwhelm more significant data when generating the zone stamp. If the new character is added to the stamp (Step 245), the randomization function value is reduced to a single base-16 character, which could be represented as a character in the set (A, B, C, . . . P). Next, in Step 246, based on the resulting value of a randomization function (either that employed in Step 242, or a different randomization function), it is determined whether the end of a zone has been reached. For example, it might be desirable to create zones of approximately 10 MB, although the present invention's system and method support zones that are much larger or much smaller than 10 MB. When the end of a new zone is identified and the size of the zone is larger than a predetermined minimum zone size (Step 247) the stamp characters that have been accumulated for this zone are stored in the zone DB along with information about the stream from which the zone originated its starting byte offset and size (Step 248). The processing then proceeds to Step 249, where the zone stamp is reset to prepare for processing the next zone. If the end of a zone is not reached in Step 246, it is determined whether the end of the application object has been reached (Step 250).

If the end of the application object has not been reached (Step 250), the processing proceeds to Step 253, where it is determined whether the maximum zone size has been reached. If the maximum number of bytes that a zone may contain has been reached (for example, 100 MB), information about that zone is stored as an entry in the zone DB (Step 254), whether or not it has an acceptable minimum stamp length character string. Such zones, whose stamps are shorter than the minimum stamp length, are processed as "low-entropy zones." Low-entropy zones contain content that is presumed to be so homogeneous that the randomization function(s) cannot adequately generate the minimum number of stamp characters or determine the end of a zone. Examples of low-entropy data stream zones that contain mostly homogeneous bytes include sparse database table dumps, and virtual machine image dumps. In some embodiments, the present invention can be configured to convert regions that contain low-entropy data into fixed size zones of 100 MB.

Figure 2D:
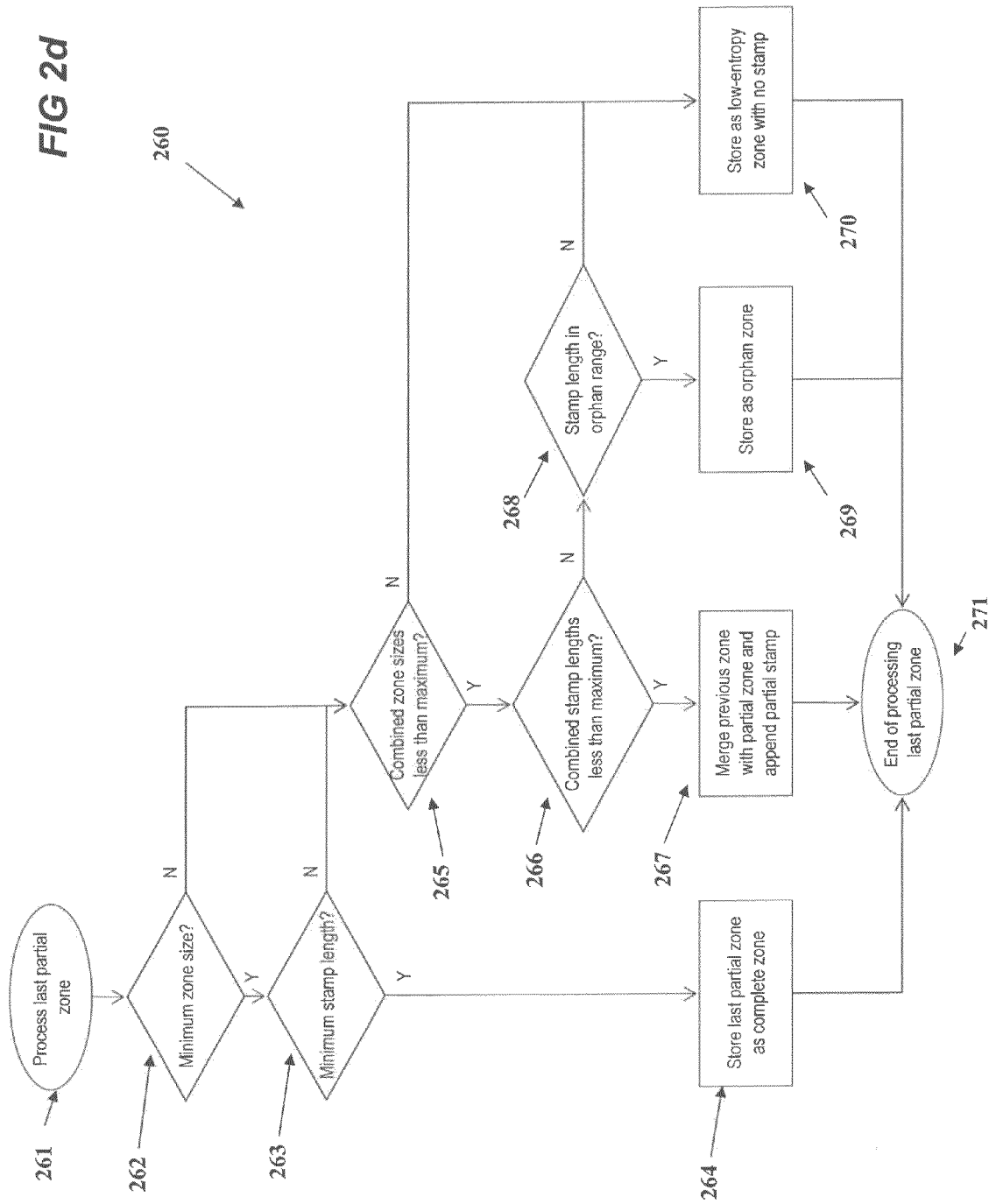
FIG. 2d is a flowchart illustrating an exemplary method for processing of the last partial zone of an application object, according to some embodiments of the present invention.

If in Step 250, it is determined that the end of an application object has been reached, the method by which the final zone of the application object and its accumulated stamp are stored in the stamp database (Step 251) is determined by the process outlined in FIG. 2d, after which processing of the application object is complete (Step 252).

The above described method 240 continues for each byte of the incoming data stream (Step 245). In some embodiments, the present invention can implement a conventional randomization function that leverages a rolling window scheme (e.g., Manber, U., "Finding Similar Files in Large File System", U. of Arizona, Dept. of Computer Science, TR 93-33, October 1993, pp. 1-10). As can be understood by one skilled in the art, other types of randomization functions can be used.

FIG. 2d is a flowchart illustrating an exemplary method 260 for processing of the last partial zone as described in FIG. 2c, Step 251. The process starts at Step 261. If the last partial zone has a size that is greater than or equal to both the minimum zone size (Step 262) and minimum zone stamp length (Step 263), it is stored as a new zone with its zone stamp (Step 264). If the sum of the sizes of the previous zone and the final partial zone is less than or equal to the maximum zone size (Step 265) and their respective stamps can be appended without exceeding the predetermined maximum stamp length (Step 266), then the partial zone and the previous zone are aggregated (Step 267). Aggregation of the previous zone and the last partial zone is accomplished by increasing the size of the previous zone to accommodate the size of the last partial zone, and appending all of the stamp characters of the partial zone to the stamp of the previous zone. If these conditions are not both met, then the zone will either be treated as a special case "orphan" zone if its stamp consists of at least 3 characters but less than the minimum required for a valid stamp (Step 269), or as a low-entropy zone with no stamp if too few stamp characters were generated (Step 270). Processing of the final partial zone is complete at Step 271.

FIG. 3 illustrates an example of the information for four zones stored as four rows of data in the zone DB. For each row illustrated the zone ID ("ZoneID"), stamp, application object ID ("AppObjectID"), zone start offset ("ZoneStart") and zone size ("ZoneSize") data are maintained as metadata for each zone. In this embodiment, there are four zones whose ZoneID ranges from 1 through 4, all belonging to the same application object (as defined by the AppObjectID). Zone 1, the first zone of the application object starts at the byte offset 0 (as indicated by the ZoneStart value of 0). Zone 2 starts at byte 10,000,123 within the application object thus the size of zone 1 is 10,000, 123 bytes. Zone 3 starts at byte 15,000,246 within the application object thus the size of 2 is 5,000,123 bytes. Zone 4 starts at byte 119,857,846 within the application object thus the size of zone 3 is 104,857,600 bytes. Zone 3 is a low-entropy zone that failed to produce an adequate zone stamp within 100 MB, as indicated by a size of exactly 100 MB and no stamp having been generated for the zone. As such it will be processed downstream in a different manner than the other three zones shown in FIG. 3. All other zones have produced an adequate zone stamp, as shown in FIG. 3. Zone stamp creation will be discussed in further detail below.

One of the advantages of the present invention is that it eliminates processing of many small zones in downstream deduplication phases since a minimum size for a zone must be reached before a zone is created. This has been a problem with many conventional deduplication systems wherein very small kilobyte-sized zones may be generated. In some embodiments, each new zone must also be large enough to generate a minimum character string length for the zone stamp so that the zone can be considered as a candidate for delta compression during downstream processing. Conventional systems also fail to associate zone size to minimum zone stamp length.

In some embodiments, the last zone of data at the end of an incoming data stream can end up as a partial zone (FIG. 2c, Step 251) that may be too short to generate a zone stamp and/or shorter in length than the minimum zone size. One of the advantages of the present invention is that it can aggregate this final partial zone with the previous zone to eliminate creating short zones. Such aggregation has a very small negative impact on the downstream delta compression effectiveness, given the large size of an application object relative to the small size of a zone. In some embodiments, low-entropy zones can also be identified and processed downstream in a different manner than zones that have generated their own zone stamp.

The following discussion describes a five-step algorithm for deduplicating a data stream using the deduplication processor. The algorithm involves the following steps: zone stamp creation, zone stamp matching, zone delta compression, low entropy zone delta compression, and deduplication across a network (FIG. 1, Step 112) such as a WAN connection to a remote location. Each of these steps will be discussed separately.

1. Zone Stamp Creation

FIG. 4 illustrates an exemplary logical diagram of two single zones (402a, 402b), according to some embodiments of the present invention. FIG. 4 further illustrates the stamp creation process 400, according to some embodiments of the present invention. For each of the two zones, a short zone stamp representing their content is created (stamps represented by 406 and stamp creation by arrows 404). As stated above, zone stamps are character strings where each character in the string represents a consecutive collection of bytes within its zone. In addition, the order of characters in the zone stamp reflects the order of data within each zone. For each newly created zone, a representative stamp is formed and stored in an in-memory database called the zone DB, as indicated in Step 408. Upon storage of the representative zone stamp in zone DB, stamp matching (Step 410) is performed in order to determine whether any stamp pairs are sufficiently similar to one another. If sufficiently similar stamp pairs are found, the processing proceeds to Step 412, where delta compression of the zones is performed and a resulting delta, or "patch" zone is stored to the disk storage area 416 which contains only the bytes that differed (414) between the two zones.

FIG. 4 shows a pair of sample zones of text data, which, as can be understood by one skilled in the art, can be much larger in size, e.g., on the order of 10 MB. For illustrative purposes only, the two sample zones differ from one another in three locations (on first line where zone 1 has "Ishmael" and zone 2 has "Frank"; on sixth line where zone 1 has "sail" and zone 2 has "cruise"; and last line where zone 1 has "November" and zone 2 has "December"). As a result of the stamp creation process 404, each zone produces a zone stamp. The stamp for zone 1 is "ABGHEOFF" and stamp for zone 2 is "HBGPEOEF". As stated above, and illustrated in FIG. 3 these stamps are stored in the zone DB 408 along with other zone metadata.

In some embodiments, the zone stamp can be computed using the randomization function that was also used to identify the end of each zone. In alternate embodiments, the present invention can be configured to use two different randomization functions, one for stamp creation and one for determining the end of a new zone. Zone stamps can be of fixed or variable length.

In some embodiments, a zone stamp is created for each zone on the basis of a base-16 text string. For example, base-16 characters can include any combinations of the following contiguous ASCII characters:

A B C D E F G H I J K L M N O P

As can be understood by one skilled in the art, the zone stamp can be created on the basis of any base. However, it would be advantageous for the purposes of the next phase of zone stamp match processing (Step 410) that the characters in such base are contiguous so as to ensure optimal matching performance during downstream processing.

When data within the application object has long runs of repeating characters, but the data is not so homogeneous that it creates a low-entropy zone, it can create zone stamps with many repeating identical characters. In order to restrict the overall string length of each zone stamp, and to maintain zone stamp strings that have "interesting content," the present invention can be configured, in some embodiments, to only allow each of the base-16 characters to be used a maximum number of times in any given stamp. For example, if this maximum is 4, the maximum stamp length for any zone is 64 characters. As can be understood by one skilled in the art, these values herein provided are for illustrative purposes and are not intended to limit the present invention, and as such, the values can be modified for optimal deduplication effectiveness. The following are some examples of typical zone stamps:

LDALDDDIFC
IACDFLIHMJIHHPNPNLOEDJIJLOED-
   JAPNPNAAHCDFLMCFMOFCMEOEBBGB
   BKKKKGGG

Many conventional randomization schemes that have been used to determine similarity between data entities are designed as plagiarism detection tools for text-based documents and employ traditional hash-based signatures to generate multiple independent fingerprints for a file. The present invention is configured to process both textual (including UTF-encoded international text) and non-textual (binary) data. Further, conventional systems also process text files in their entirety, whereas the present invention is configured to find zones within a single file (sub-file), at the file level or across multiple files (super-file) that can be identified as similar or identical to other super-file, file or sub-file zones.

Additionally, conventional systems perform selection of fingerprints from a set of representative fingerprints within all of fingerprints computed from the data stream. Such a selection process includes selecting some number of fingerprints having the smallest (min-wise) value or the largest value, or some number of fingerprints within a set number of bytes of the largest or smallest fingerprint, etc. Thus, in the conventional systems, selection of a good representative subset of fingerprints can not only be computationally expensive, but also often leads to suboptimal deduplication results. The present invention is configured to solve this problem, by producing zone stamps whose characters are not independent of each other. Each zone stamp character represents a contiguous region within the zone and adjacent zone stamp characters represent adjacent sub-zones of the actual application object. In addition, during stamp matching, zone stamps are processed as character strings rather than independent fingerprints.

Some conventional systems (e.g., Douglis, F., Iyengar, A., "Application-specific Delta-encoding via Resemblance Detection", 2003 USENIX Annual Technical Conference, pp. 1-14) store from 30 to 100 position-independent fingerprints and compare these independent fingerprints against a database of as many fingerprints per row for each new block. In contrast, the present invention store position-dependent fingerprints as a simple string of 32 bytes of data (i.e. 64 base-16 4-bit entities). Further, other conventional systems store SHA-1 hashes for every ~8 KB of data, resulting in fingerprint metadata as high as 0.24% of the size of the original chunk data, which is highly ineffective in terms of storage and memory consumption. One of the key advantages of the present invention is that it can represent the content as well as the order of up to 100 MB of data in only 32 bytes, and often fewer, thus producing a worst case metadata overhead of 0.000031%.

2. Zone Stamp Matching

In this phase of the deduplication process, the character-string zone stamps computed for each zone in the previous phase are compared against all other zone stamps to determine which pairs of zones are most likely to produce a high delta compression ratio when they are later delta-compressed.

Some conventional deduplication systems employ multiple hash-based fingerprints to represent chunks of data in order to determine similarity with other chunks. In these systems, a similarity score is based on the percentage of exactly matching fingerprints. This process of exactly matching multiple large fingerprints can be extremely time-consuming to perform since it involves comparing N-hashes (where, for example, N=25) with N-hashes for every entry in the chunk database against all other entries in the chunk database. With a 10 terabyte ("TB") appliance and an average chunk size of 10 KB, this amounts to 1 billion chunk entries to compare, each with several fingerprint hashes. Using the system of the present invention, a 10 TB appliance with 10 MB zones has a zone database of 1 million entries as opposed to 1 billion entries of conventional deduplication systems. Also, using the system of the present invention, each zone stamp is a simple character string that is compared against other character strings, which are less than or equal to 64 base-16 characters in length. As shown in FIG. 4 (a high-level process of reading the entries in the stamp database, looking for similar zone stamps and passing the associated pairs of zones off to be delta compressed), zone stamp matching is performed after zone stamp creation, but before intra-zone delta compression.

Figure 5:
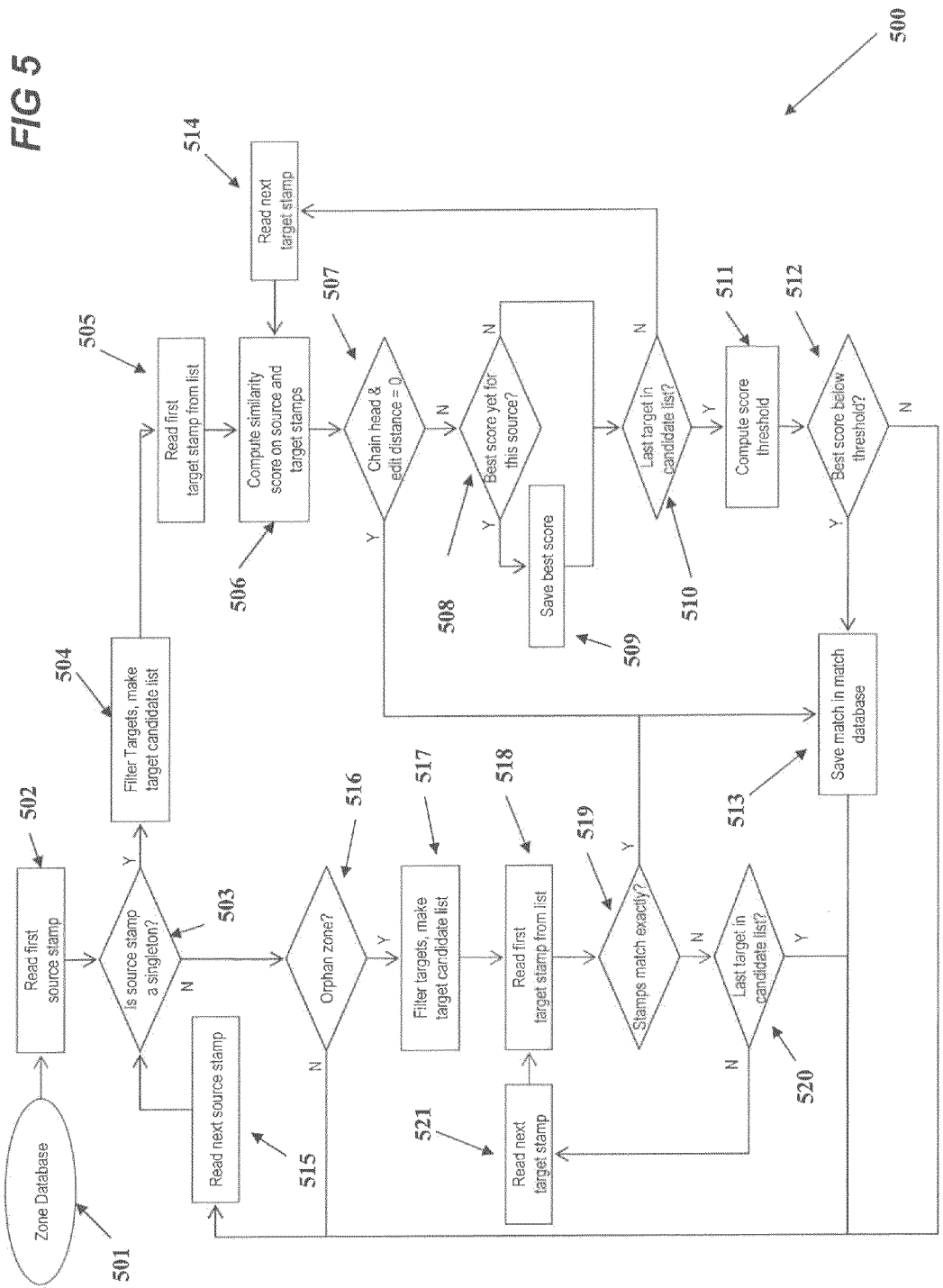
FIG. 5 is a flowchart illustrating an exemplary method for matching zone stamps, according to some embodiments of the present invention.

FIG. 5 is a flowchart illustrating an exemplary method 500 for zone stamp matching, according to some embodiments of the present invention. The method 500 includes four phases of filtering, comparing, thresholding, and match optimization.

A. Filtering Phase

The method begins in the zone database 501 by reading a first source stamp, as shown in Step 502. A determination is made whether the first source stamp represents a zone that has not been matched with another zone yet (Step 503). A zone that has not been matched with another zone is called a singleton, where an orphan (FIG. 2d, Step 269) is a special type of singleton that requires special consideration that will be discussed below. If the zone is not a singleton (Step 503) or an orphan (Step 516), then processing proceeds to Step 515, where additional source stamps are read until a singleton is found. However, if the zone is a singleton, processing continues to Step 504, where a filtered list of zone stamps called the "target candidate list" is created from the entire list of zone stamps found in the zone DB. A subset of the stamps on the target candidate list will be compared against the source stamp. In Step 505, the first target stamp from the created candidate list is read. As can be understood by one skilled in the art, the source stamps can represent any new zones that come from any stream of data that is being or has been received. Source stamps of zones in the subsequently received data can be compared within their own received stream or streams that have been already received.

The filtering phase serves the purpose of reducing the number of stamp comparisons that should be performed. In some embodiments, the following filtering processes can be applied to create the target candidate list from all of the stamps in the zone database:

Only zones whose size in bytes is within some percentage of the size of the source zone being matched are considered as target candidates. While dramatically reducing the execution time of the comparing of stamps, it also produces candidate pairs of zones that are more likely to delta compress well since they are similar in size. It is less probable that two zones whose content is similar, but differ in size by a large percentage will produce a good delta compression ratio. To further accelerate the process of searching for target candidates, the zone database entries may be stored in a data structure that lends itself to easily finding the first and last target candidate zones in size order, including but not limited to a linked list.

Of the pair of zones that are delta compressed, one remains uncompressed and the other is delta compressed, as further illustrated in and discussed in connection with FIG. 7. Once a stamp match has been found, the zone that will be delta compressed in downstream processing can have its entry removed from consideration for future stamp compares/matched. It is now no longer a singleton, but is instead a "version." This has the effect of continually shrinking the size of the zone database during the process of comparison and delta compression, which in itself is an ongoing form of filtering the zone DB.

B. Comparison Phase

Once the filtering phase has been completed, the processing continues to Step 505, where the comparison of zone stamps phase takes place. During the comparison phase, the source zone stamp and all of the target candidate zone stamps are compared against each other to find the best match candidate. The most popular mechanism for comparing two character strings for similarity employ the use of the "Levenshtein edit distance" algorithm (see, e.g., Levenshtein, V. I., "Binary Codes Capable of Correcting Deletions, Insertions, and Reversals", Cybernetics and Control Theory, Soviet Physics—Doklady, Vol. 10, No. 8, February 1996, pp. 707-710). Levenshtein edit distance is a score of the number of insertions, deletions and modifications required-to convert one string into another string. FIG. 6 illustrates an example of the Levenshtein edit distance matrix computation. In this example, converting the word "sitting" to "kitten" requires 3 changes (change "s" to "k", change "i" to "e," and delete "g"), thus an edit distance value of 3. Lower edit distance values correspond to increased similarity, where an edit distance of zero occurs when comparing two identical strings.

As shown in FIG. 6, the Levenshtein edit distance algorithm employs a two-dimensional matrix where each cell in the matrix is computed serially in a column-wise fashion. Using the typical Levenshtein algorithm for two strings of length M and N, the computational complexity of calculating the edit distance score is O(MN). With potentially 1,000,000 zone stamps to compare against each other, use of Levenshtein edit distance computation is too time-consuming to be a viable algorithm. Fortunately, acceleration techniques have been developed to more quickly determine the edit distance between two strings. Some of these techniques include a bit-parallel processing technique that reduces the time it takes to determine stamp matching across hundreds of thousands of zone stamps. (See, e.g., Myers, G., "A Fast Bit-Vector Algorithm for Approximate String Matching Based on Dynamic Programming", Journal of the ACM, Vol. 46, No. 3, May 1999, pp. 395-415). Myers' method, when combined with the design constraints of a maximum of 64 character zone stamps and processor hardware that it runs on, reduces the Levenshtein O(MN) algorithm to a complexity of O(N). This is a significant improvement in the edit distance computation time, especially given the fact that M and N could be as large as 64 (or any other limit) characters.

In some embodiments, the present invention's maximum stamp length can be limited to 64 characters, thereby generating a 64-bit vector that corresponds to the entries in a column of the Levenshtein edit distance matrix (see FIG. 6), with one of the two stamps being contained in a single 64-bit computer word. For a source stamp that need to be compared against the target candidate filtered list, the accelerated bit-parallel edit distance computation is performed and a resulting score is computed. This score is used later to determine whether the two zones associated with the two stamps that were favorably compared and as such would make good delta compression candidates.

Referring back to FIG. 5, the comparison phase of the method 500 begins with the computation of similarity score on the source and target stamps (e.g., two stamps being compared to one another), as indicated by Step 506. Subsequent to computing the similarity score, the method proceeds to Step 508, where a determination is made whether the computed score is the best score for the source found for all targets processed thus far. If so, zone information about the best score pair is maintained in the memory, as indicated in Step 509. Otherwise, processing continues to Step 510, wherein the present invention's system evaluates whether there are any more target candidates in the list created in Step 504. If more candidates are available, the method proceeds to Step 514, where next stamp in the target candidate list is read and evaluated. If the target stamp compared is the last stamp on the candidate list, the method proceeds to the thresholding phase beginning with Step 511, as discussed below.

C. Thresholding Phase

The thresholding phase begins in Step 511. In Step 511, only the lowest edit distance result obtained and stored in memory (Step 509) above is considered. A score of zero indicates that the stamps are identical, and thus the zones they represent are likely to be substantially similar, or possibly identical. In some embodiments, pairs of zones that are substantially similar generate very small delta-compressed patch zones. In some embodiments, a patch zone that is created by delta compressing two larger zones of data can be configured to replace one of the two larger zones, thereby allowing the illustrated deduplication process to store fewer bytes than the original pair of zones.

Edit distance scores that approach the value of the shorter length of the two stamp strings being compared identify substantially dissimilar zones that should not be delta compressed since they will most likely create very large patch zones. In some embodiments, a predefined or dynamically computed threshold edit distance score can be defined in a range between zero and a predefined maximum. Otherwise the threshold score can be defined or computed, as shown in Step 511. In some embodiments, the threshold function can be linear or a function based upon the lengths of the two zone stamps and the resulting best score match value. In some embodiments, the function can be derived empirically. If the threshold is improperly defined or computed or predetermined, the following negative side-effects may occur:

If the predefined or computed threshold score is set closer to zero than it should be, a number of would-be great delta compression opportunities may be lost, thereby producing less than optimal data deduplication rates.

If the predefined or computed threshold score is set closer to the maximum value than it should be, a number of zone pairs may produce poor delta compression results.

In some embodiments of the invention, the target candidate list can be generated not only limiting the size of the zones to be compared, but also taking into consideration the stamp lengths. Stamps that are dissimilar in length by a predetermined, calculated or empirically derived maximum number of bytes, or whose lengths deviate by the threshold value described above, have a high probability of producing bad delta compression, allowing these zones and their respective stamps to be precluded from the matching phase by filtering them from the target candidate list in Step 504.

After performing the edit distance computation on the stamps of a pair of zones, the edit distance score is compared to the computed threshold score (Step 512). In some embodiments, if the edit distance score resulting from the comparison of two stamp zones is found to be below the threshold score, the compared stamp zones will most likely produce excellent delta compression results. In this case, the match is stored in the match database (Step 513). However, if the edit distance score is above the threshold, then processing immediately continues to the next source stamp in the zone DB (Step 515) without storing an entry in the match database or precluding any zones from being matched against subsequent source zones.

With the present invention's thresholding mechanism in place, the rate of zone pairs producing delta compression results that poorer than a 3:1 reduction in size was below 0.2%, indicating only 2 zones out of 1,000 matched pairs produce poor delta compression results, making the algorithm highly effective in deduplicating data streams.

D. Match Optimization Phase

Searching for the best match using the method 500 is, in some embodiments of the invention, further accelerated by searching for an exact stamp match, where the Levenshtein edit distance is 0 (indicative of a high degree of similarity in the data represented by the stamp) where the target stamp represents the head of an existing version chain (Step 507). In order to achieve the highest data reduction, it is better to match a new singleton to the head of a version chain instead of a new or existing singleton. In the event that an exact stamp match is found to a target version chain head, the matching process immediately terminates, saving the match as illustrated by Step 513.

In some embodiments of the present invention, it may prove most time efficient and sufficiently space efficient to utilize the first target zone match producing an acceptable edit distance score. In such an implementation, similarity computation can be further accelerated within Step 507 using criteria more loosely defined than an exact stamp match with a target version chain head. For example, a threshold can be set such that any exact stamp match is considered to be a "good enough" match, sufficient to bypass further similarity computations and store the matched pair of zones in the match database (Step 513).

Orphan zones are singletons produced only in special cases at the end of an application object region, as shown in FIG. 2d, Step 269, where there is a short stamp representing a zone larger than the minimum zone size. If the source stamp read in Steps 502 or 515 represents an orphan zone (Step 516), then a target candidate list (Step 517) is selected using similar or identical criteria as described for Step 504, and target candidates processed as illustrated in Step 518. As orphan zones, by definition, have short zone stamps, sufficient similarity must be defined as an edit distance of zero, or an exact match in order to maximize the probability of good delta compression between matched zones. As such, if an exact stamp match is found (Step 519), then the matched pair of zones is stored in the match database (Step 513) and processing continues to the next source stamp (Step 515). If all target candidates have been exhausted (Step 520) with no exact stamp match found, then no matching pair of zones is stored in the match database and processing continues to Step 515 to process the next source stamp.

FIG. 7 illustrates an exemplary storing of zones of data as delta compressed zones, according to some embodiments of the present invention. The right half of FIG. 7 shows the structure of data that has been previously deduplicated using a deduplication processor 106. Data that in the past was found to be similar is stored in reverse delta chains. A reverse delta chain is made up of one head and one or more delta compressed versions. There may be thousands of independent reverse delta chains stored in a deduplication processor 106 with its associated disk storage 106.

The chain head represents the most recent version of all of the versions in the reverse delta chain and all versions are linked together as they arrived over time. The most recent version is maintained as the head of the chain for quickest access by end users since it is most likely the version that owners of the data are most interested in accessing in the future.

Singletons are chain heads with no versions. When their zones were created and their stamps were compared, there were no stamps that matched theirs.

All other incoming zones are also considered singletons. During the stamp comparison phase of the method 500, all new singletons are compared against each other and also against the stamps of all chain heads and singletons (but not versions) that have been considered for deduplication in the past. In order to achieve the highest data reduction, it is better to match a new singleton to the head of a chain instead of a new or existing singleton (see FIG. 5, Step 507). Associating a new singleton with an existing chain head produces fewer short version chains, which improves the overall data deduplication rate. When match optimization is being performed, there is a preference to associating a new singleton with an existing chain head of a reverse delta chain as opposed to another singleton.

After processing all incoming data, there will still be some zones that have not had their stamps match any other singleton's stamp or chain head's stamp. A zone database of these singletons and their stamps is maintained so that future incoming data has the benefit of being matched against either one of the older singletons or one of the chain heads. In some embodiments, the stamp information for the delta version of each reverse delta chain need not be maintained, so these are purged from the zone database as soon as they become part of a reverse delta chain. By eliminating these entries from the zone database, future stamp compare operations are accelerated.

Some conventional backup/archive system that manage historical versions of files use delta versioning. These systems are limited to name-based matching of client server and pathname and filename strings to determine candidates for intra-file delta versioning. This has the shortcoming of not being able to deduplicate data with slightly different or slightly modified alias names. Other conventional systems include a document repository that maintains historical versions of documents by delta compressing identically named files as they change over time. One of the advantages of the present invention is that it does not rely on name-based matching between zones of files in order to locate similar pairs of zones for delta-compression purposes. This allows zones of files that are located on different servers, in different directories and with different file names to be associated with each other. Further, the present invention uses a high-performance string-similarity-based scheme as an alternative to the time consuming process of comparing potentially billions of sets of N hash entries to determine similar files.

3. Zone Delta Compression

In this phase of the present invention's deduplication process, zones that are on average about 10 MB are generated. As can be understood by one skilled in the art other average sizes can be implemented without deviating from the scope of the present invention and the claims. In some embodiments, a conventional two-pass delta compression algorithm can be applied to pairs of similar zones to produce a patch zone that contains a recipe of insert and copy commands to recreate the second zone from the patch zone and the first zone. Conventional two-pass delta compression algorithms consume a significant amount of memory when the source zone and target zone are a few hundreds of megabytes in size. All zones with a size greater than a predetermined minimum zone size and less than 100 MB are processed using delta compression. At zone sizes equal to or greater than 100 MB, the zone is considered to be a low-entropy zone and processed with data compression instead of delta compression, which is discussed below.

In alternate embodiments, the present invention's deduplication process can use a conventional two-pass "greedy" algorithm to accelerate performance of the delta compression. An example of the "greedy" algorithm is disclosed in Burns, R. C., "Differential Compression: A Generalized Solution for Binary Files", U. of California Santa Cruz, December 1996, pp. 1-61; and, U.S. Pat. No. 6,374,250 to Ajtai et al., both of which are incorporated herein by reference in their entireties.

4. Low Entropy Zone Data Compression

When the content of the data in the data stream is so homogeneous that a natural end-of-zone offset is not identified within 100 MB, a low-entropy zone is created at 100 MB (for example). In some embodiments, the present invention can be configured to implement methods for processing low-entropy zones within a data stream using conventional data compression techniques, which can effectively deduplicate low-entropy zones. An example of such data compression techniques is a Lempel-Ziv data compression technique, disclosed in (See, e.g., http://en.wikipedia.org/wiki/LZ77_and_LZ78).

5. Deduplication Across a Network

When deduplication is performed on zones, only the data-compressed zone (low-entropy zone) or the delta compressed patch zone are sent to a deduplication processor 104 at a second site (See, FIG. 1). In the case of delta compression, a forward and a reverse delta compression operation is performed locally. The reverse delta computation allows version chain at the local data center to be stored with the most recent version of each zone being stored Lempel-Ziv compressed and all earlier versions stored in a delta compressed form. At the remote site, a similar structure is maintained. In order to create the latest "full" version offsite, a forward delta zone is computed locally and sent to the remote site, where the most recent forward delta, when combined with the remote site's current most recent version, allows the most recent version of the first site to be created and Lempel-Ziv compressed.

Some conventional systems reduce bandwidth on a network between two locations by employing content-based splitting and chunk hashing. These systems can only detect identical chunks of data within a data stream. One of the advantages of the present invention is its ability to detect similar as well as identical zones within a data stream, and only transmit the bytes that are different between two similar zones from one data center to another data center across a WAN or any other network.

While the invention has been described with reference to above embodiments and examples, those skilled in the art recognize that various modifications may be made to the invention without departing from the spirit and scope thereof.

Although particular embodiments have been disclosed herein in detail, this has been done by way of example for purposes of illustration only, and is not intended to be limiting with respect to the scope of the appended claims, which follow. In particular, it is contemplated that various substitutions, alterations, and modifications may be made without departing from the spirit and scope of the invention as defined by the claims. Other aspects, advantages, and modifications are considered to be within the scope of the following claims. The claims presented are representative of the inventions disclosed herein. Other, unclaimed inventions are also contemplated. The applicant reserves the right to pursue such inventions in later claims.

What is claimed is:

1. A method for transmission and/or deduplication of data across a network, comprising the steps of:
    receiving a data stream comprising a plurality of zones;
    analyzing the received data stream to determine a starting location and an ending location of each zone within the received data stream;
    based on the starting and ending locations, generating a first zone stamp identifying a first zone, the first zone stamp includes a sequence of contiguous characters representing of at least a portion of data in the first zone, wherein the order of characters in the first zone stamp corresponds to the order of data in the first zone;
    generating a second zone stamp identifying a second zone, the second zone stamp includes a sequence of contiguous characters representing of at least a portion of data in the second zone, wherein the order of characters in the second zone stamp corresponds to the order of data in the second zone, wherein the second zone having a smaller size than the first zone;
    wherein each zone stamp is configured to have a length between a predetermined minimum zone stamp length and a predetermined maximum zone stamp length;
    comparing the first zone stamp with another first zone stamp of another first zone in any data stream received;
    comparing the second zone stamp with another second zone stamp of another second zone in any data stream received;
    determining whether the first zone is substantially similar to another first zone by detecting that the first zone stamp is substantially similar to another first zone stamp;
    determining whether the second zone is substantially similar to another second zone by detecting that the second zone stamp is substantially similar to another second zone stamp;
    delta-compressing zones within any data stream received that have been determined to have substantially similar zone stamps, thereby deduplicating zones having substantially similar zone stamps within the received data stream; and
    optionally transmitting the deduplicated zones across the network from one storage location to another storage location;
    wherein each zone in any data stream received is characterized by a predetermined minimum and maximum zone size and a predetermined minimum and maximum zone stamp length;
    wherein zones that are to be delta-compressed have a size greater than the predetermined minimum zone size and less than the predetermined maximum size and a stamp length greater than the predetermined minimum zone stamp length.

2. The method according to claim 1, further comprising storing each zone stamp in a zone database, wherein the zone database is configured to store zone stamps of the zones within any data stream received.

3. The method according to claim 1, wherein said delta-compressing further comprising eliminating redundant data from any data stream received.

4. The method according to claim 1, wherein said analyzing further comprises
    defining an end zone located at an end of the received data stream.

5. The method according to claim 4, wherein said generating of the first and the second zone stamps further comprises aggregating the defined end zone with a zone preceding the defined end zone for delta-compressing, when size of the defined end zone is less than the predetermined minimum zone size for the first zone and/or the second zone.

6. The method according to claim 4, wherein said generating the first and the second zone stamps comprises aggregating the defined end zone with a zone preceding the defined end zone for delta-compressing, when a total combined length of zone stamps for the defined end zone and a zone preceding the defined zone is less than the predetermined maximum zone stamp length for the first zone and/or the second zone.

7. The method according to claim 4, wherein said generating the first and the second zone stamps further comprises creating a separate end zone stamp for the defined end zone for delta-compressing, when size of the defined end zone is greater than the predetermined minimum zone size and the predetermined minimum zone stamp length for the first and/or the second zones.

8. The method according to claim 6, wherein a zone stamp of the preceding zone remains unchanged.

9. The method according to claim 1, wherein each zone stamp has at least one of the following lengths: a fixed length and a variable length.

10. The method according to claim 1, wherein at least one of the first and the second zones is a low entropy data zone, wherein the low entropy data zone includes homogeneous data within any data stream received.

11. The method according to claim 1, wherein said comparing further comprises
    comparing zone stamps of zones having a difference in respective zone sizes that is less than or equal to a predetermined zone size difference;
    wherein zones having a difference in respective zone sizes that is greater than the predetermined zone size difference are not compared to each other.

12. The method according to claim 11, further comprising upon determining that compared zones are substantially similar to one another, discontinuing comparison of at least one compared zone to other zones in any data stream received.

13. The method according to claim 12, wherein said determining further comprises computing an edit distance score between the compared zone stamps, wherein the edit distance score is configured to reflect the number of differences between the compared zone stamps, wherein each compared zone stamp is limited by a predetermined maximum zone stamp length.

14. The method according to claim 13, wherein said determining comprises
    comparing the computed edit distance score to a predetermined threshold distance score; and,
    determining that the compared zones are substantially similar when the computed edit distance score is less than the predetermined threshold distance score.

15. The method according to claim 14, wherein the computed edit distance score closer to zero indicates that the compared zones are substantially similar.

16. The method according to claim 14, wherein the predetermined threshold distance score is a function of a length of a shorter zone stamp of the zone stamps being compared.

17. The method according to claim 14, wherein said determining whether the zone is substantially similar to another zone further comprises upon comparison of zone stamps of zones, selecting a best match between a pair of zones in any data stream received for comparison with other zones in any data stream received.

18. The method according to claim 10, further comprising data compressing the low entropy data zone.

19. The method according to claim 1, wherein each zone stamp is configured to contain a predetermined number of repeating characters.

20. The method according to claim 19, wherein at least one of the first and second zones is a low entropy data zone when a zone stamp of at least one of the first and second zones contains a number of repeating characters that are configured to exceed the predetermined number of repeating characters.

21. The method according to claim 1, wherein the predetermined maximum size of each zone stamp length is sixty four characters.

22. The method according to claim 1, wherein the generating further comprises
generating zone stamps identifying zones while performing the analyzing the received data stream to determine the starting location and the ending location of the zone.

23. The method according to claim 1, wherein the comparing further comprises
comparing the first zone stamp of the first zone and another first zone stamp of another first zone; and
comparing the second zone stamp of the second zone and another second zone stamp of another second zone;
wherein at least one of the first and second zone is a most recent version of data and the at least one of another first and second zone is a most recent version of another data.

24. The method according to claim 1, wherein the comparing step further comprises
comparing first zone stamps of first zones, wherein the compared first zone stamps have substantially similar lengths; and
comparing second zone stamps of second zones, wherein the compared second zone stamps have substantially similar lengths.

25. A system for transmission and/or deduplication of data across a network, comprising:
a processor coupled to a storage system;
said processor is configured to
receive a data stream comprising a plurality of zones;
analyze the received data stream to determine a starting location and an ending location of each zone within the received data stream;
based on the starting and ending locations, generate a first zone stamp identifying a first zone, the first zone stamp includes a sequence of contiguous characters representing of at least a portion of data in the first zone, wherein the order of characters in the first zone stamp corresponds to the order of data in the first zone;
generate a second zone stamp identifying a second zone, the second zone stamp includes a sequence of contiguous characters representing of at least a portion of data in the second zone, wherein the order of characters in the second zone stamp corresponds to the order of data in the second zone, wherein the second zone having a smaller size than the first zone;
wherein each zone stamp is configured to have a length between a predetermined minimum zone stamp length and a predetermined maximum zone stamp length;
compare the first zone stamp with another first zone stamp of another first zone in any data stream received;
compare the second zone stamp with another second zone stamp of another second zone in any data stream received;
determine whether the first zone is substantially similar to another first zone by detecting that the first zone stamp is substantially similar to another first zone stamp;
determine whether the second zone is substantially similar to another second zone by detecting that the second zone stamp is substantially similar to another second zone stamp;
delta-compress zones within any data stream received that have been determined to have substantially similar zone stamps, thereby deduplicating zones having substantially similar zone stamps within the received data stream; and
optionally transmit the deduplicated zones across the network from one storage location to another storage location;
wherein each zone in any data stream received is characterized by a predetermined minimum and maximum zone size and a predetermined minimum and maximum zone stamp length;
wherein zones that are to be delta-compressed have a size greater than the predetermined minimum zone size and less than the predetermined maximum size and a stamp length greater than the predetermined minimum zone stamp length.

26. A non-transitory computer-readable medium encoded with computer program instructions for performing transmission and/or deduplication of data across a network, the computer program instructions comprising:
receiving a data stream comprising a plurality of zones;
analyzing the received data stream to determine a starting location and an ending location of each zone within the received data stream;
based on the starting and ending locations, generating a first zone stamp identifying a first zone, the first zone stamp includes a sequence of contiguous characters representing of at least a portion of data in the first zone, wherein the order of characters in the first zone stamp corresponds to the order of data in the first zone;
generating a second zone stamp identifying a second zone, the second zone stamp includes a sequence of contiguous characters representing of at least a portion of data in the second zone, wherein the order of characters in the second zone stamp corresponds to the order of data in the second zone, wherein the second zone having a smaller size than the first zone;
wherein each zone stamp is configured to have a length between a predetermined minimum zone stamp length and a predetermined maximum zone stamp length;
comparing the first zone stamp with another first zone stamp of another first zone in any data stream received;
comparing the second zone stamp with another second zone stamp of another second zone in any data stream received;
determining whether the first zone is substantially similar to another first zone by detecting that the first zone stamp is substantially similar to another first zone stamp;
determining whether the second zone is substantially similar to another second zone by detecting that the second zone stamp is substantially similar to another second zone stamp;

delta-compressing zones within any data stream received that have been determined to have substantially similar zone stamps, thereby deduplicating zones having substantially similar zone stamps within the received data stream; and optionally transmitting the deduplicated zones across the network from one storage location to another storage location;

wherein each zone in any data stream received is characterized by a predetermined minimum and maximum zone size and a predetermined minimum and maximum zone stamp length;

wherein zones that are to be delta-compressed have a size greater than the predetermined minimum zone size and less than the predetermined maximum size and a stamp length greater than the predetermined minimum zone stamp length.

27. A system for storing and transmitting data, comprising a processor communicating with a storage location, wherein said processor is configured to receive a data stream comprising a plurality of zones from a plurality of sources;

said processor is configured to analyze the received data stream to determine a starting location and an ending location of each zone within the received data stream;

based on the starting and ending locations, generate a first zone stamp identifying a first zone, the first zone stamp includes a sequence of contiguous characters representing of at least a portion of data in the first zone, wherein the order of characters in the first zone stamp corresponds to the order of data in the first zone;

generate a second zone stamp identifying a second zone, the second zone stamp includes a sequence of contiguous characters representing of at least a portion of data in the second zone, wherein the order of characters in the second zone stamp corresponds to the order of data in the second zone, wherein the second zone having a smaller size than the first zone;

wherein each zone stamp is configured to have a length between a predetermined minimum zone stamp length and a predetermined maximum zone stamp length;

compare the first zone stamp with another first zone stamp of another first zone in any data stream received;

compare the second zone stamp with another second zone stamp of another second zone in any data stream received;

determine whether the first zone is substantially similar to another first zone by detecting that the first zone stamp is substantially similar to another first zone stamp;

determine whether the second zone is substantially similar to another second zone by detecting that the second zone stamp is substantially similar to another second zone stamp;

delta-compress zones within any data stream received that have been determined to have substantially similar zone stamps, thereby deduplicating zones having substantially similar zone stamps within the received data stream; and optionally transmit the deduplicated zones to the storage device for storage;

wherein each zone in any data stream received is characterized by a predetermined minimum and maximum zone size and a predetermined minimum and maximum zone stamp length;

wherein zones that are to be delta-compressed have a size greater than the predetermined minimum zone size and less than the predetermined maximum size and a stamp length greater than the predetermined minimum zone stamp length.

28. The system according to claim 27, wherein the plurality of sources is selected from a group consisting of: an archive location, a database, an email server, a fileserver, a backup server, a document management server, and a replication server, wherein each said source is configured to communicate with said processor.

29. The system according to claim 27, wherein said processor is configured to transmit deduplicated zones via a deduplication processor to at least one or both of a local storage location and a remote storage location.

* * * * *